United States Patent
Chikagawa et al.

(10) Patent No.: US 6,713,417 B2
(45) Date of Patent: Mar. 30, 2004

(54) INSULATIVE CERAMIC COMPACT

(75) Inventors: Osamu Chikagawa, Moriyama (JP); Naoya Mori, Omihachiman (JP); Yasutaka Sugimoto, Kyoto (JP)

(73) Assignee: Murata Manufacturing Co., Ltd., Kyoto-fu (JP)

(*) Notice: Subject to any disclaimer, the term of this patent is extended or adjusted under 35 U.S.C. 154(b) by 280 days.

(21) Appl. No.: 09/909,337

(22) Filed: Jul. 19, 2001

(65) Prior Publication Data

US 2002/0027018 A1 Mar. 7, 2002

(30) Foreign Application Priority Data

Jul. 21, 2000 (JP) .................................. 2000-220868
Jul. 21, 2000 (JP) .................................. 2000-220869

(51) Int. Cl.[7] .................................. C03C 14/00
(52) U.S. Cl. .................................. 501/32; 501/53; 501/73; 501/77; 501/108; 501/123; 428/210; 174/258
(58) Field of Search .................................. 428/210; 501/32, 501/53, 73, 77, 108, 123; 174/257, 258

(56) References Cited

U.S. PATENT DOCUMENTS

| 4,069,498 A | * | 1/1978 | Joshi | 257/713 |
| 4,794,048 A | * | 12/1988 | Oboodi et al. | 428/432 |
| 5,394,011 A | * | 2/1995 | Yamamoto et al. | 257/693 |
| 5,632,942 A | * | 5/1997 | Yeh et al. | 156/89.17 |
| 5,944,124 A | * | 8/1999 | Pomerleau et al. | 175/320 |
| 6,225,694 B1 | * | 5/2001 | Terui | 257/704 |

FOREIGN PATENT DOCUMENTS

| GB | 2360036 | 9/2001 |
| GB | 2360037 | 9/2001 |
| JP | 05-238774 | 9/1993 |
| JP | 6-34668 | 2/1996 |
| JP | 09-208298 | 8/1997 |

* cited by examiner

*Primary Examiner*—Kamand Cuneo
*Assistant Examiner*—Jose H. Alcala
(74) *Attorney, Agent, or Firm*—Dickstein, Shapiro, Morin & Oshinsky, LLP.

(57) ABSTRACT

An insulative ceramic compact is composed of a fired mixture of (A) a $MgAl_2O_4$, $Mg_3B_2O_6$ and/or $Mg_2B_2O_5$ ceramic powder, and (B) a glass powder including from about 13 to 50% by weight of silicon oxide in terms of $SiO_2$, from 8 to 60% by weight of boron oxide in terms of $B_2O_3$, about 20% by weight or less of aluminum oxide in terms of $Al_2O_3$, and from about 10 to 55% by weight of magnesium oxide in terms of MgO. The insulative ceramic compact can be obtained by firing at low temperatures of about 1000° C. or less, can be obtained by sintering with Ag or Cu, has a low dielectric constant and a high Q value, and is suitable for use in the high-frequency range.

20 Claims, 4 Drawing Sheets

INSULATIVE CERAMIC COMPACT

BACKGROUND OF THE INVENTION

1. Field of the Invention

The present invention relates to an insulative ceramic compact for use in, for example, a multilayer circuit board. Specifically, the present invention relates to an insulative ceramic compact that can be advantageously used in a composite multilayer circuit board on which a semiconductor device or a variety of electronic parts is mounted, and can be obtained by firing in conjunction with a conductive material such as copper or silver.

2. Description of the Related Art

Recent tendencies to accelerate and to use electronic equipment in higher frequencies keep on expanding. With such tendencies, demands for the accelerating, higher-density mounting and higher-density packing of electronic parts which are used in such electronic equipment are increasing. To satisfy these demands, multilayer circuit boards are conventionally used as substrates on which semiconductor devices and various electronic parts are mounted. In such a multilayer circuit board, the substrate houses a conductive circuit and an electronic part functional device to thereby further miniaturize electronic equipment.

Alumina has been conventionally frequently used as a material for constituting the multilayer circuit board. Alumina has a relatively high firing temperature from 1500° C. to 1600° C., and high-melting (refractory) metals such as Mo, Mo—Mn and W must be generally used as materials for conductive circuits housed in such a multilayer circuit board composed of alumina. However, these refractory metals have a high electric resistance.

Strong demands have been therefore made on the use of a metal such as copper as a conductive material, which metal has a lower electric resistance and is available at a lower cost than the refractory metals. To use copper as a conductive material, the use of a glass ceramic or crystallized glass which can be obtained by firing at low temperatures of 1000° C. or less has been proposed (e.g., Japanese Unexamined Patent Application Publication No. 5-238774).

Alternatively, the use of a ceramic having a thermal expansion coefficient close to that of Si as a material for such multilayer circuit boards has been proposed, in consideration of connection with semiconductor devices such as Si chips (Japanese Unexamined Patent Application Publication No. 8-34668).

However, these conventional substrate materials that can be fired at low temperatures have low mechanical strengths and a low Q value, and the type and proportion of the deposited crystal phase are readily affected by the firing process.

Additionally, the substrate materials described in Japanese Unexamined Patent Application Publications No. 5-238774 and No. 8-34668 cannot be significantly sintered in conjunction with highly dielectric materials having a high thermal expansion coefficient.

SUMMARY OF THE INVENTION

Accordingly, an object of the present invention is to provide an insulative ceramic compact that can solve the above problems, can be obtained by firing at low temperatures and can be obtained by firing in conjunction with a conductive material having a relatively low melting point such as silver or copper, has a low relative dielectric constant, and has satisfactory high-frequency characteristics and a high thermal expansion coefficient.

Another object of the present invention is to provide a multilayer ceramic substrate which is composed of the aforementioned insulative ceramic compact, can be obtained by firing at low temperatures, has a low relative dielectric constant and satisfactory high-frequency characteristics, and can be obtained by sintering in conjunction with a highly dielectric material having a high thermal expansion coefficient, as well as to provide a ceramic electronic part using the multilayer ceramic substrate.

Specifically, the present invention provides, in an aspect, an insulative ceramic compact which includes a fired mixture of (A) a $MgAl_2O_4$ ceramic powder; and (B) a glass powder including from about 13 to 50% by weight of silicon oxide calculated as $SiO_2$, from about 8 to 60% by weight of boron oxide calculated as $B_2O_3$, from 0 to about 20% by weight of aluminum oxide calculated as $Al_2O_3$, and from about 10 to 55% by weight of magnesium oxide calculated as MgO.

The content of silicon oxide in terms of $SiO_2$ in the glass powder is from about 13 to 50% by weight, and preferably from about 20 to 30% by weight relative to the total weight of the glass powder. If the content of silicon oxide is less than about 13% by weight, the resulting sintered compact has a decreased degree of crystallization and a decreased Q value. In contrast, if it exceeds about 50% by weight, the resulting glass has an excessively high melting temperature.

The content of boron oxide in terms of $B_2O_3$ in the glass powder is from about 8 to 60% by weight and preferably from about 30 to 60% by weight, relative to the total weight of the glass powder. The boron oxide mainly acts as a fusing agent (flux). If the content of boron oxide in terms of $B_2O_3$ is less than about 8% by weight, the melting temperature becomes excessively high, and if it exceeds 60% by weight, the resulting sintered compact has a decreased moisture resistance.

In the glass powder, the content of aluminum oxide in terms of $Al_2O_3$ is from 0 to about 20% by weight relative to the total weight of the glass powder. The aluminum oxide content in terms of $Al_2O_3$ may be 0% by weight, that is, aluminum oxide may not be necessarily contained in the glass powder. Accordingly, when the insulative ceramic compact according to the present invention contains no aluminum oxide, it is an insulative ceramic compact composed of a fired mixture of (A) $MgO$—$MgAl_2O_4$ ceramic powder and (B) a glass powder including from about 13 to 50% by weight of silicon oxide in terms of $SiO_2$ and from about 3 to 60% by weight of boron oxide in terms of $B_2O_3$.

When the content of aluminum oxide in terms of $Al_2O_3$ in the glass powder exceeds about 20% by weight, the resulting sintered compact cannot become sufficiently dense and has a decreased Q value. The lower limit of the aluminum oxide content in terms of $Al_2O_3$, if it is contained, is any value more than 0% by weight.

The glass powder preferably contains from about 10 to 55% by weight of MgO. MgO plays a role to decrease a melting temperature in the manufacture of glass and also plays a role as a component constituting crystals in a crystallized glass. Particularly, a $MgO$—$B_2O_3$ compound exhibits a Qf value of several ten thousands gigahertz or more and is a predominant factor to exhibit satisfactory high-frequency characteristics. If the content of MgO is less than about 10% by weight, the resulting insulative ceramic compact has a decreased Q value, and if it exceeds about 55% by weight, the insulative ceramic compact may have excess amounts of deposited crystals to thereby deteriorate the strengths of the substrate.

The glass powder for use in the present invention preferably further includes at least one alkaline earth metal oxide selected from among BaO, SrO and CaO in a proportion of about 20% by weight or less relative to the total weight of the glass powder.

The alkaline earth metal oxide serves to decrease the melting temperature in the manufacture of glass and to increase the thermal expansion coefficient of glass. If the content of the alkaline earth metal oxide exceeds about 20% by weight, the resulting insulative ceramic compact may have a decreased Q value.

The glass powder for use in the present invention preferably further includes at least one alkali metal oxide selected from among $Li_2O$, $K_2O$ and $Na_2O$ in a proportion of about 10% by weight or less, and more preferably from about 2 to 5% by weight, relative to the total weight of the glass powder. The alkali metal oxide serves to decrease the melting temperature in the manufacture of glass. If the content of alkali metal oxide exceeds about 10% by weight, the resulting insulative ceramic compact may have a decreased Q value.

The invented insulative ceramic compact preferably further includes zinc oxide in a proportion calculated as ZnO of about 15% by weight or less, more preferably about 10% by weight or less, relative to the total weight of the ceramic compact. The zinc oxide serves to decrease the firing temperature. However, if the content of zinc oxide in terms of ZnO exceeds about 15% by weight, the resulting sintered compact may not become sufficiently dense in some cases.

The zinc oxide is preferably contained as a component other than the ceramic powder and glass powder, but may be contained as a component constituting the glass component.

The invented insulative ceramic compact preferably further includes copper oxide in a proportion in terms of CuO of about 3% by weight or less, and more preferably about 2% by weight or less, relative to the total weight of the ceramic compact. The copper oxide serves to decrease the firing temperature. However, if the content of the copper oxide exceeds about 3% by weight, the resulting insulative ceramic compact may have a decreased Q value. The copper oxide is preferably contained as a component other than the ceramic powder and glass powder, but may be contained as a component constituting the glass component.

In the invented insulative ceramic compact, the weight ratio of the ceramic powder to the glass powder is preferably from about 20:80 to 80:20 and more preferably from about 30:70 to 50:50. If the ratio of the ceramic powder is higher than the above range, the resulting sintered compact may have a decreased density. If the proportion of the glass powder is higher than the above range, the sintered compact may have a decreased Q value.

The invented insulative ceramic compact may preferably have a Q value of about 700 or more as determined at a frequency of 15 GHz. If the insulative ceramic compact has a Q value of about 700 or more, it can be used as a circuit device substrate recently used in the high-frequency range.

A glass powder obtained by calcining a glass composition at a temperature from about 700° C. to 1400° C. may be used as the glass powder.

In another aspect, the present invention provides a multilayer ceramic substrate which includes an insulative ceramic layer composed of the insulative ceramic compact according to the present invention; and plural inner electrodes formed in the insulative ceramic layer.

In the multilayer ceramic substrate, a second ceramic layer may be laminated at least on one side of the insulative ceramic layer, which second ceramic layer has a dielectric constant higher than that of the insulative ceramic layer.

The plural inner electrodes in the multilayer ceramic substrate may be arrayed in parallel with each other with the interposition of at least part of the insulative ceramic layer to thereby constitute a capacitor.

The plural inner electrodes may include conductive coils constituting an inductor.

In addition and advantageously, the present invention provides a ceramic electronic part including the invented multilayer ceramic substrate and at least one electronic part device, which electronic part device is mounted on the multilayer ceramic substrate and constitutes a circuit with the plural inner electrodes.

The ceramic electronic part may further include a cap being fixed to the multilayer ceramic substrate so as to surround the electronic part device. The cap is preferably a conductive cap.

The ceramic electronic part according to the present invention may further include plural outer electrodes formed only on the underside of the multilayer ceramic substrate, and plural conductive through-holes that are electrically connected to the outer electrodes and are electrically connected to the inner electrode or electronic part device.

The present invention also relates to a multilayer ceramic electronic part which includes a ceramic sintered compact composed of the invented insulative ceramic compact, plural inner electrodes that are arrayed inside the ceramic sintered compact, and plural outer electrodes that are formed on the outer surface of ceramic sintered compact and are electrically connected to any of the inner electrodes.

In the aforementioned multilayer ceramic electronic part, the plural inner electrodes may be arrayed in parallel with each other with the interposition of the ceramic layer to thereby constitute a capacitor unit. In the multilayer ceramic electronic part, the plural inner electrodes may further include plural conductive coils in addition to the inner electrodes constituting the capacitor unit, which plural conductive coils are connected with each other to thereby constitute a multilayer inductor unit.

Furthermore, another object of the present invention is to provide an insulative ceramic compact that can solve the above problems, can be obtained by firing at low temperatures and can be obtained by firing in conjunction with a conductive material having a relatively low-melting such as silver or copper, has a high Q value in the high-frequency range and a low relative dielectric constant, and has satisfactory high-frequency characteristics and a high thermal expansion coefficient.

Another object of the present invention is to provide a multilayer ceramic substrate which is composed of the aforementioned insulative ceramic compact, has a low relative dielectric constant and a high Q value and therefore has satisfactory high-frequency characteristics, has a high thermal expansion coefficient and can be obtained by sintering in conjunction with a highly dielectric material, as well as to provide a ceramic electronic part using the multilayer ceramic substrate.

Specifically, the present invention provides, in an aspect, an insulative ceramic compact being composed of a fired mixture of (A) at least one selected from among a $Mg_3B_2O_6$ ceramic powder and a $Mg_2B_2O_5$ ceramic powder; and (B) a glass powder including from about 13 to 50% by weight of silicon oxide in terms of $SiO_2$, from about 8 to 60% by weight of boron oxide in terms of $B_2O_3$, from 0 to about 20% by weight of aluminum oxide in terms of $Al_2O_3$, and from about 10 to 55% by weight of magnesium oxide in terms of MgO.

In the present invention, at least one of a $Mg_3B_2O_6$ ceramic powder and a $Mg_2B_2O_5$ ceramic powder is used as ceramic powder (A). Specifically, a $Mg_3B_2O_6$ ceramic powder alone or a $Mg_2B_2O_5$ ceramic powder alone may be used, and a mixture of these powders may also be used.

The content of $SiO_2$, $B_2O_3$, $Al_2O_3$, etc., in the glass powder is as described above for the reasons stated earlier.

In the invented insulative ceramic compact, the weight ratio of the ceramic powder to the glass powder is preferably from about 20:80 to 80:20 and more preferably from 40:60 to 60:40. If the ratio of the ceramic powder is higher than the above range, the resulting sintered compact may have a decreased density. If the proportion of the glass powder is higher than the above range, the sintered compact may have a decreased Q value.

In particular, the invented insulative ceramic compact can be obtained by firing a mixture containing the ceramic powder and the glass powder at low temperatures of 1000° C. or less, and can be obtained by firing in conjunction with a low-melting metal such as copper or silver. Accordingly, the invented insulative ceramic compact can be advantageously used, for example, in a multilayer ceramic substrate using a conductive material composed of such a low-melting metal.

The invented insulative ceramic compact may preferably have a Q value of about 700 or more as determined at a frequency of 15 GHz. If the insulative ceramic compact has a Q value of about 700 or more, it can be used as a recent circuit element substrate for use in the high-frequency range.

The invented insulative ceramic compact has a high thermal expansion coefficient, and can be sintered in conjunction with a highly dielectric material having a high thermal expansion coefficient to thereby easily and stably yield an integrally sintered compact composed of the invented insulative ceramic compact and a highly dielectric ceramic.

In another aspect, the present invention provides a multilayer ceramic substrate including an insulative ceramic layer composed of the insulative ceramic compact; and plural inner electrodes formed in the insulative ceramic layer.

In the multilayer ceramic substrate, a second ceramic layer may be laminated at least on one side of the insulative ceramic layer, which second ceramic layer has a dielectric constant higher than that of the insulative ceramic layer.

The plural inner electrodes in the multilayer ceramic substrate may be arrayed in parallel with each other with the interposition of at least part of the insulative ceramic layer to thereby constitute a capacitor. The plural inner electrodes may include conductive coils constituting an inductor.

In addition and advantageously, the present invention provides a ceramic electronic part including the aforementioned multilayer ceramic compact and at least one electronic part device, which electronic part device is mounted on the multilayer ceramic substrate and constitutes a circuit with the plural inner electrodes.

The ceramic electronic part may further include a cap being affixed to the multilayer ceramic substrate so as to surround the electronic part device. The cap is preferably an electrically conductive cap.

The electronic part according to the present invention may further include plural outer electrodes formed on the underside alone of the multilayer ceramic substrate, and plural conductive through-holes that are electrically connected to the inner electrode or electronic part device.

The present invention also relates to a multilayer ceramic electronic part which includes a ceramic sintered compact composed of the invented insulative ceramic compact, plural inner electrodes that are arrayed inside the ceramic sintered compact, and plural outer electrodes that are formed on the outer surface of ceramic sintered compact and are electrically connected to any of the inner electrodes.

In the aforementioned multilayer ceramic electronic part, the plural inner electrodes may be arrayed in parallel with each other with the interposition of a ceramic layer to thereby constitute a capacitor unit.

In the multilayer ceramic electronic part, the plural inner electrodes may further include plural conductive coils in addition to the inner electrodes constituting the capacitor unit, and the plural conductive coils are connected with each other to thereby constitute a multilayer inductor unit.

DESCRIPTION OF THE PREFERRED EMBODIMENTS

The present invention will be illustrated in further detail, initially with reference to several working examples of an insulative ceramic compact according to the invention, and further with reference to configurational embodiments of a multilayer ceramic substrate, ceramic electronic part and multilayer ceramic electronic part relating to the present invention.

First, configurational embodiments of a multilayer ceramic substrate, ceramic electronic part, and multilayer ceramic electronic part using the invented insulative ceramic compact will be described below.

Figure 1:
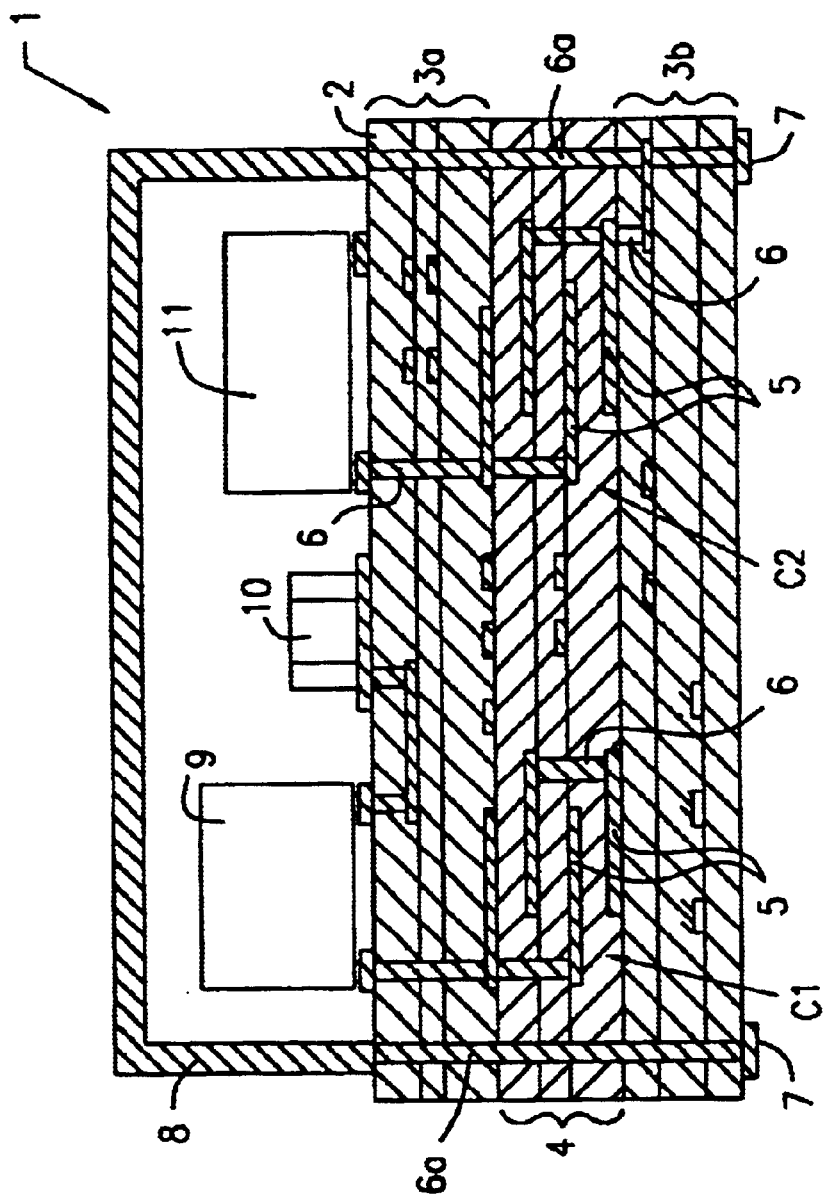
FIG. 1 is a longitudinally sectional view showing a multilayer ceramic module as a ceramic electronic part using a multilayer ceramic substrate as an embodiment of the present invention.
Figure 2:
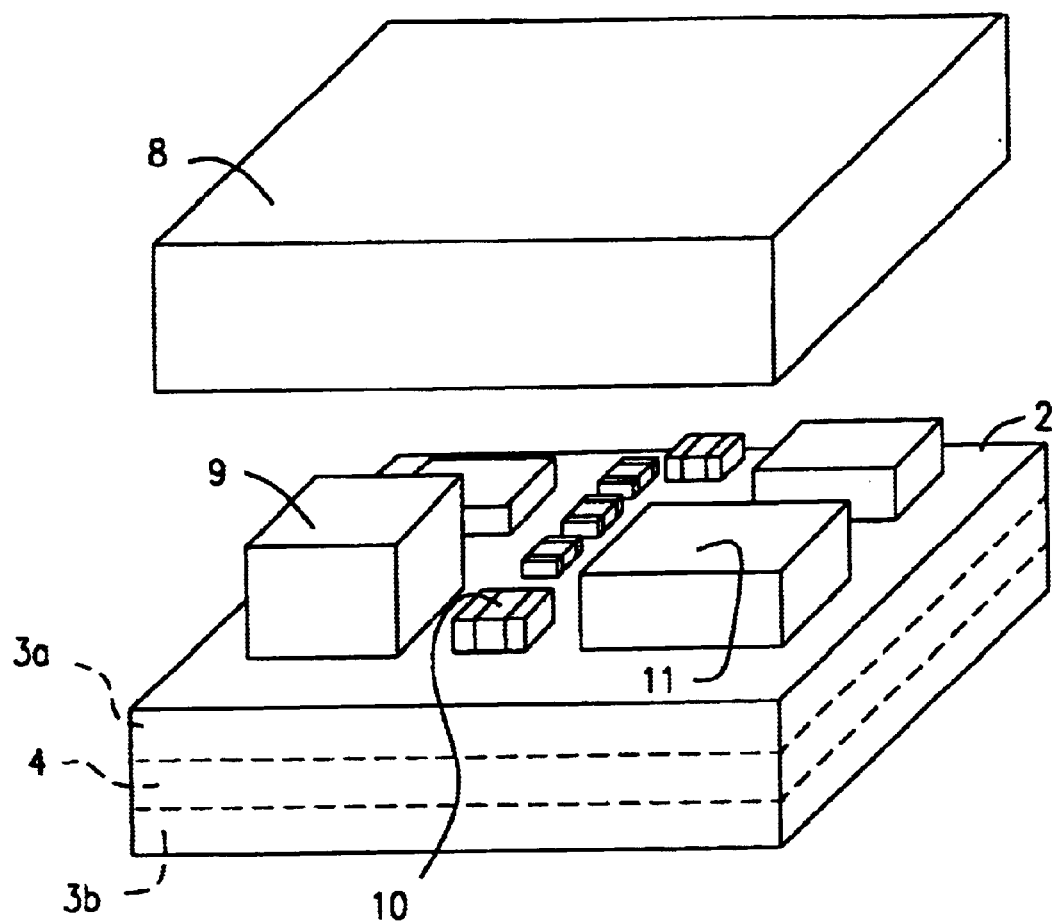
FIG. 2 is an exploded perspective view of the multilayer ceramic module shown in FIG. 1.

FIG. 1 is a longitudinally sectional view showing a multilayer ceramic module as a ceramic electronic part using a multilayer ceramic substrate as an embodiment of the present invention, and FIG. 2 is an exploded perspective view thereof.

Multilayer ceramic module 1 is composed of multilayer ceramic substrate 2.

Multilayer ceramic substrate 2 includes insulative ceramic layers 3a and 3b composed of the invented insulative ceramic compact, and dielectric ceramic layer 4 sandwiched between insulative ceramic layers 3a and 3b. Dielectric ceramic layer 4 is composed of, for example, barium titanate and a glass and has a relatively high dielectric constant.

Inside dielectric ceramic layer 4, plural inner electrodes 5 are arrayed so as to be adjacent to each other with the interposition of part of dielectric ceramic layer 4 to thereby constitute multilayer capacitor units C1 and C2.

Insulative ceramic layers 3a and 3b and dielectric ceramic layer 4 include plural via-hole electrodes 6 and 6a or an inner wiring formed therein.

Electronic part devices 9 through 11 are mounted on the top face of multilayer ceramic substrate 2. As electronic part devices 9 through 11, semiconductor devices, chip-type multilayer capacitors and other appropriate electronic part devices can be used. Via-hole electrodes 6 and the inner wiring electrically connect these electronic part devices 9 through 11 to capacitor units C1 and C2 to thereby constitute a circuit of multilayer ceramic module 1 according to the present embodiment.

Conductive cap 8 is fixed on the top face of multilayer ceramic substrate 2. Conductive cap 8 is electrically connected to via-hole electrode 6a which penetrates multilayer ceramic substrate 2 from top to bottom. Outer electrodes 7 are formed on the underside of multilayer ceramic substrate 2 and are electrically connected to via-hole electrodes 6 and 6a. Other outer electrodes, not shown in the figure, are formed only on the underside of multilayer ceramic substrate 2 and are electrically connected via the inner wiring to electronic part devices 9 through 11 and/or capacitor units C1 and C2.

The formation of outer electrodes 7 only on the underside of multilayer ceramic substrate 2 for connection to outside allows the surface mounting of the multilayer ceramic module on, for example, a printed circuit board by use of the underside.

According to the present embodiment, cap 8 is composed of a conductive material and is electrically connected via via-hole electrode 6a to outer electrode 7, to thereby electromagnetically shield electronic part devices 9 through 11. However, cap 8 is not necessarily composed of a conductive material.

Insulative ceramic layers 3a and 3b in multilayer ceramic module 1 according to the present embodiment are each composed of the invented insulative ceramic compact, and therefore exhibit a low dielectric constant and a high Q value, and the resulting multilayer ceramic module 1 is suitable for use in the high-frequency range.

Multilayer ceramic substrate 2 can be easily obtained by known techniques for monolithically firing ceramic laminates. Specifically, ceramic green sheets mainly containing an insulative ceramic material relating to the present invention are initially prepared, electrode patterns are printed for constituting, for example, inner electrodes 5, outer wiring, and via-hole electrodes 6 and 6a, and the patterned ceramic green sheets are laminated. An appropriate number of plies of the patterned ceramic green sheets for the formation of the outer wiring and via-hole electrodes 6 and 6a are laminated onto a ceramic green sheet, on top and under sides of which insulative ceramic layers 3a and 3b are to be formed. The resulting laminate is then pressurized in a thickness direction. The thus-prepared laminate is fired to thereby easily yield multilayer ceramic substrate 2.

Figure 3:
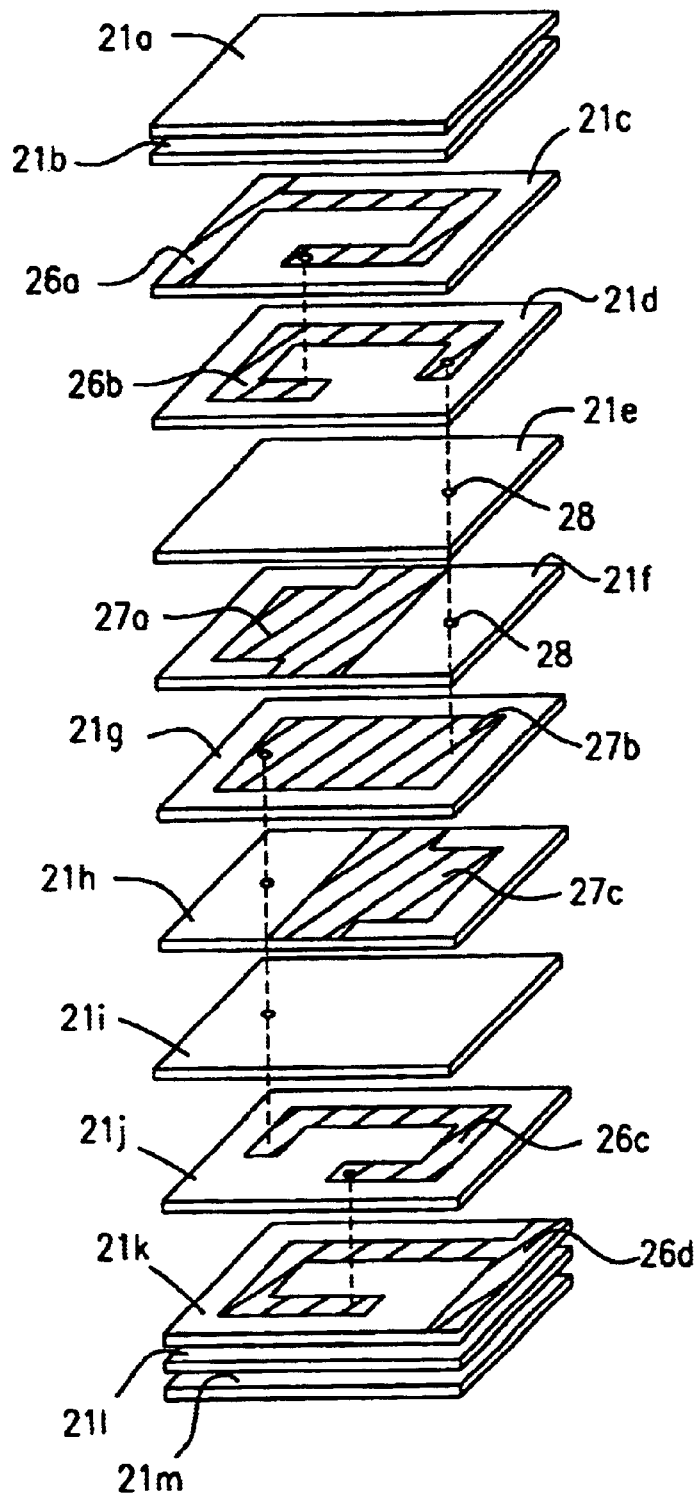
FIG. 3 is an exploded perspective view showing ceramic green sheets and electrode patterns formed thereon for use in the manufacture of a multilayer ceramic electronic part as a second embodiment of the present invention.
Figure 4:
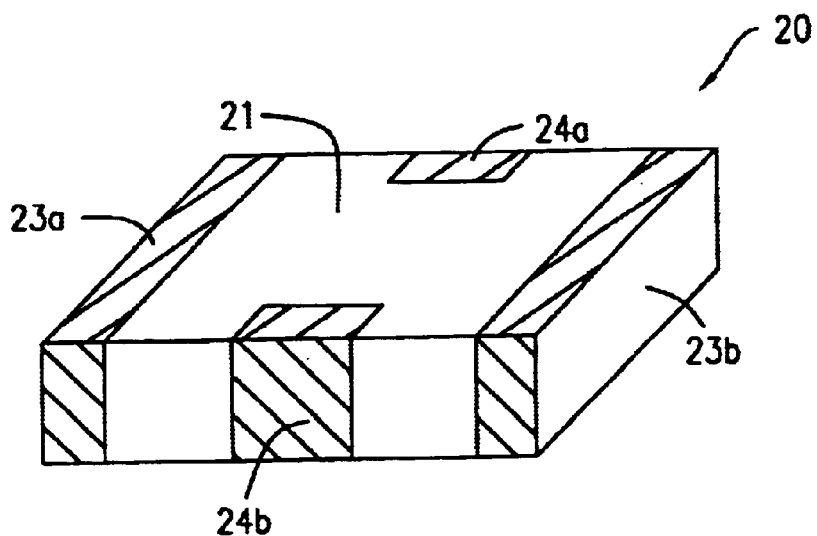
FIG. 4 is a perspective view showing the multilayer ceramic electronic part as the second embodiment of the present invention.
Figure 5:
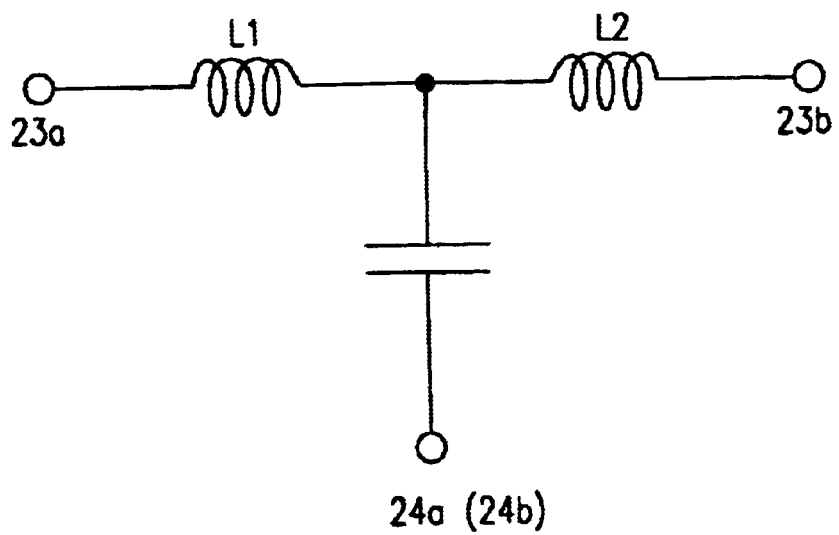
FIG. 5 is a diagram showing a circuitry of the multilayer ceramic electronic part shown in FIG. 4.

FIGS. 3 through 5 are respectively an exploded perspective view, an external perspective view and a circuit diagram showing a multilayer ceramic electronic part as a second configurational embodiment of the present invention.

Multilayer ceramic electronic part 20 shown in FIG. 4 is an LC filter including ceramic sintered compact 21 and a circuit formed inside ceramic sintered compact 21. The circuit constitutes an inductance L and a capacitance C described below. Ceramic sintered compact 21 is composed of the invented insulative ceramic compact. Outer electrodes 23a, 23b, 24a and 24b are formed on the outer surface of the ceramic sintered compact 21, and an LC resonant circuit shown in FIG. 5 is formed among outer electrodes 23a, 23b, 24a and 24b.

The configuration of ceramic sintered compact 21 will be illustrated in further detail by showing a manufacturing process thereof, with reference to FIG. 3.

Initially, an organic vehicle is added to an insulative ceramic material relating to the present invention to yield a ceramic slurry. The ceramic slurry is molded by an appropriate sheet molding technique to yield a ceramic green sheet. The prepared ceramic green sheet is dried and is punched to a given size to yield rectangular ceramic green sheets 21a through 21m.

Next, a via hole for the formation of via-hole electrode 28 is formed on ceramic green sheets 21a through 21m according to necessity. Further, a conductive paste is printed by the screen process to form conductive coils 26a and 26b, capacitor inner electrodes 27a through 27c and conductive coils 26c and 26d, and the via hole for via-hole 28 is filled with the conductive paste to thereby form via-hole electrode 28.

Subsequently, the ceramic green sheets are laminated in a direction shown in the figure, and are pressurized in the thickness direction to yield a laminate. The resulting laminate is fired to thereby yield ceramic sintered compact 21.

Outer electrodes 23a through 24b are formed on above-prepared ceramic sintered compact 21 as shown in FIG. 4 by, for example, a technique for the formation of thin films such as application and baking of conductive pastes, vapor deposition, plating or sputtering. Thus, multilayer ceramic electronic part 20 is obtained.

With reference to FIG. 3, conductive coils 26a and 26b constitute inductance unit L1, and conductive coils 26c and 26d constitute inductance unit L2 and inner electrodes 27a through 27c constitute capacitor C, as shown in FIG. 5.

The LC filter in multilayer ceramic electronic part 20 according to the present embodiment has the aforementioned configuration. Ceramic sintered compact 21 is composed of the invented insulative ceramic compact and can therefore be obtained by firing at low temperatures as in multilayer ceramic substrate 2 according to the first embodiment. Accordingly, the ceramic compact can be monolithically fired with copper, silver, gold and other low-melting metals as conductive coils 26a through 26c and capacitor inner electrodes 27a through 27c as inner electrodes. In addition, the resulting LC filter has a high Q value in the high-frequency range and is hence suitable for use in the high-frequency range.

The present invention is illustrated with reference to the first and second configurational embodiments by taking multilayer ceramic module 1 and multilayer ceramic electronic part 20 constituting an LC filter as an example. However, the ceramic electronic part and multilayer ceramic electronic part according to the present invention is not limited to these configurations. Specifically, the invention can also be applied to multilayer ceramic substrates for multi-chip modules, multilayer ceramic substrates for hybrid integrated circuits (hybrid ICs), and other various multilayer ceramic substrates and to various ceramic electronic parts including electronic part devices mounted on these multilayer ceramic substrates, as well as to chip-type multilayer capacitors, chip-type multilayer dielectric antennas and other various chip-type multilayer electronic parts.

EXAMPLE 1

Initially, a $Mg(OH)_2$ powder and an $Al_2O_3$ powder as starting materials were weighed so that the resulting sintered compact would have a stoichiometric composition of $MgAl_2O_4$, and were wet-mixed for 16 hours and were then dried. The dried mixture was calcined at 1350° C. for two hours and was crushed.

Next, 20 to 80% by weight of the above-prepared calcined material, a glass powder (sintering aid) having the composition indicated in Table 1, and ZnO and CuO were mixed in the proportions indicated in Table 2, and the mixture was granulated with an appropriate amount of a binder. Each of granulated mixtures corresponding to Samples 1 to 46 was molded at a pressure of 200 MPa to yield a cylindrical green compact 12 mm in diameter and 7 mm in thickness.

The green compact was fired at a temperature from 900° C. to 1000° C. in air for two hours to yield cylindrical insulative ceramic compacts corresponding to Samples 1 to 46 shown in Tables 2 and 3.

These cylindrical insulative ceramic compacts were subjected to measurement of relative dielectric constant $\in_r$ at a resonant frequency (15 GHz) by the method using a both-ends-short-circuited dielectric resonator, and of Q value.

The results are shown in Tables 2 and 3.

The relative densities of the cylindrical insulative ceramic compacts are also shown in Tables 2 and 3.

TABLE 1

| Glass | $SiO_2$ (wt %) | $B_2O_3$ (wt %) | MgO (wt %) | $Al_2O_3$ (wt %) | BaO (wt %) | SrO (wt %) | CaO (wt %) | $Li_2O$ (wt %) |
|---|---|---|---|---|---|---|---|---|
| A | 22 | 31 | 55 | — | — | — | — | 2 |
| B | 20 | 41 | 28 | 6 | — | — | — | 5 |
| C | 13 | 60 | 12 | 10 | — | — | — | 5 |
| D | 50 | 25 | 17 | 3 | — | — | — | 5 |
| E | 40 | 8 | 35 | 10 | — | — | — | 7 |
| F | 42 | 29 | 9 | 20 | — | — | — | — |
| G | 12 | 60 | 13 | 10 | — | — | — | 5 |
| H | 51 | 25 | 16 | 3 | — | — | — | 5 |
| I | 13 | 61 | 11 | 10 | — | — | — | 5 |
| J | 35 | 29 | 15 | 21 | — | — | — | — |
| K | 33 | 33 | — | — | — | — | 20 | 10 |
| L | 40 | 7 | 36 | 10 | — | — | — | 7 |
| M | 35 | 36 | — | 20 | 5 | 4 | — | — |
| N | 19 | 40 | 21 | — | — | — | 20 | — |
| O | 33 | 33 | 24 | — | — | — | — | 10 |
| P | 33 | 33 | 23 | — | — | — | — | 11 |
| Q | 22 | 30 | 56 | — | — | — | — | 2 |
| R | 35 | 36 | 10 | 10 | 5 | 4 | — | — |
| S | 19 | 40 | 20 | — | — | — | 21 | — |

TABLE 2

| No. | $MgAl_2O_4$ (wt %) | Glass Amount (wt %) | Glass Type | ZnO (wt %) | CuO (wt %) | Firing Temperature (° C.) | Relative Density (%) | Thermal Expansion Coefficient (ppm/° C.) | $\epsilon_r$ | Q |
|---|---|---|---|---|---|---|---|---|---|---|
| 1 | 20 | 80 | A | 0 | 0 | 1000 | 97 | 10.5 | 7.0 | 1000 |
| 2 | 30 | 70 | A | 0 | 0 | 1000 | 97 | 10.3 | 7.0 | 1200 |
| 3 | 30 | 70 | A | 8 | 2 | 1000 | 98 | 10.2 | 7.0 | 1500 |
| 4 | 40 | 60 | A | 10 | 3 | 1000 | 99 | 9.8 | 7.1 | 1700 |
| 5 | 50 | 50 | A | 15 | 1 | 900 | 99 | 9.5 | 7.1 | 2000 |
| 6 | 80 | 20 | A | 0 | 3 | 1000 | 99 | 9.3 | 7.1 | 1100 |
| 7 | 80 | 20 | A | 0 | 4 | 1000 | 99 | 9.3 | 7.1 | 700 |
| 8 | 10 | 90 | A | 0 | 3 | 1000 | 97 | 10.0 | 7.0 | 700 |
| 9 | 50 | 50 | B | 10 | 2 | 900 | 100 | 9.2 | 7.1 | 2000 |
| 10 | 60 | 40 | B | 10 | 3 | 900 | 98 | 9.0 | 7.0 | 2200 |
| 11 | 40 | 60 | B | 9 | 2 | 900 | 98 | 9.1 | 7.0 | 1800 |
| 12 | 20 | 80 | B | 5 | 3 | 900 | 98 | 9.5 | 7.0 | 1000 |
| 13 | 20 | 80 | B | 15 | 3 | 900 | 98 | 9.1 | 7.0 | 1700 |
| 14 | 20 | 80 | B | 16 | 3 | 900 | 97 | 9.1 | 7.0 | 1400 |
| 15 | 50 | 50 | C | 0 | 0 | 900 | 99 | 9.3 | 7.1 | 800 |
| 16 | 60 | 40 | C | 7 | 0 | 900 | 99 | 9.2 | 7.0 | 900 |
| 17 | 60 | 40 | C | 11 | 0 | 900 | 99 | 9.1 | 7.1 | 1100 |
| 18 | 60 | 40 | C | 15 | 1 | 1000 | 98 | 9.0 | 7.0 | 1500 |
| 19 | 60 | 40 | C | 15 | 4 | 1000 | 98 | 9.0 | 7.0 | 1000 |
| 20 | 80 | 20 | C | 0 | 3 | 1000 | 98 | 9.0 | 7.0 | 900 |
| 21 | 90 | 10 | C | 0 | 3 | 1000 | 97 | 8.9 | 7.0 | 700 |
| 22 | 50 | 50 | D | 0 | 0 | 1000 | 98 | 9.2 | 7.1 | 900 |
| 23 | 50 | 50 | D | 13 | 1 | 1000 | 98 | 9.0 | 7.1 | 1500 |
| 24 | 50 | 50 | E | 5 | 3 | 1000 | 98 | 10.0 | 7.1 | 800 |
| 25 | 20 | 80 | F | 10 | 2 | 1000 | 97 | 9.5 | 7.0 | 600 |
| 26 | 10 | 90 | F | 10 | 2 | 1000 | 97 | 9.5 | 7.0 | 600 |
| 27 | 50 | 50 | G | 0 | 0 | 1000 | 97 | 9.3 | 7.0 | 600 |
| 28 | 50 | 50 | H | 0 | 0 | 1000 | 97 | 9.0 | 7.0 | 600 |
| 29 | 50 | 50 | H | 13 | 1 | 1000 | 98 | 8.6 | 7.1 | 600 |
| 30 | 50 | 50 | I | 0 | 0 | 900 | 99 | 9.1 | 7.1 | 700 |

TABLE 3

| No. | MgAl$_2$O$_4$ (wt %) | Glass Amount (wt %) | Type | ZnO (wt %) | CuO (wt %) | Firing Temperature (° C.) | Relative Density (%) | Thermal Expansion Coefficient (ppm/° C.) | $\epsilon_r$ | Q |
|---|---|---|---|---|---|---|---|---|---|---|
| 31 | 20 | 80 | J | 10 | 2 | 1000 | 97 | 9.1 | 7.0 | 700 |
| 32 | 50 | 50 | K | 13 | 3 | 1000 | 96 | 11.4 | 7.0 | 300 |
| 33 | 60 | 40 | K | 13 | 3 | 1000 | 96 | 11.0 | 7.0 | 220 |
| 34 | 50 | 50 | L | 5 | 3 | 1000 | 98 | 10.9 | 7.1 | 600 |
| 35 | 40 | 60 | M | 7 | 0 | 900 | 99 | 11.4 | 7.1 | 400 |
| 36 | 50 | 50 | M | 0 | 0 | 1000 | 96 | 11.6 | 7.0 | 300 |
| 37 | 50 | 50 | N | 4 | 2 | 1000 | 98 | 11.2 | 7.1 | 750 |
| 38 | 50 | 50 | O | 0 | 0 | 1000 | 97 | 10.3 | 7.1 | 800 |
| 39 | 40 | 60 | O | 5 | 2 | 900 | 98 | 10.1 | 7.0 | 1000 |
| 40 | 30 | 70 | O | 3 | 3 | 900 | 98 | 10.2 | 7.0 | 1100 |
| 41 | 50 | 50 | O | 0 | 0 | 1000 | 97 | 10.4 | 7.1 | 800 |
| 42 | 50 | 50 | P | 0 | 0 | 1000 | 98 | 10.3 | 7.0 | 700 |
| 43 | 20 | 80 | Q | 0 | 0 | 1000 | 96 | 10.5 | 6.9 | 600 |
| 44 | 40 | 60 | R | 7 | 0 | 900 | 99 | 11.6 | 7.1 | 800 |
| 45 | 50 | 50 | R | 0 | 0 | 1000 | 96 | 11.4 | 7.0 | 700 |
| 46 | 50 | 50 | S | 4 | 2 | 1000 | 98 | 11.3 | 7.1 | 700 |

Samples 25 and 26 using Glass F shown in Table 1 and Sample 27 using Glass G shown in Table 1 each had a low Q value of 600.

Likewise, Samples 28 and 29 using Glass H, Sample 34 using Glass L, and Sample 43 using Glass Q each had a low Q value of 600.

In contrast, Samples 1 to 24, 30 to 33, 35 to 42, and 44 to 46 corresponding to the invented examples could be obtained by sintering at low temperatures from 900° C. to 1000° C. and the resulting sintered compacts were dense and each have a relative density of 97% or more. The resulting insulative ceramic compacts each had a low relative dielectric constant of about 7, a high thermal expansion coefficient from 8 to 12 ppm/° C., and a high Q value as determined at a frequency of 15 GHz of 700 or more.

These results show that the present invention can provide insulative ceramic compacts that can be obtained by firing at low temperatures and are optimal for use in high-frequency electronic parts.

EXAMPLE 2

Initially, a Mg(OH)$_2$ powder and a B$_2$O$_3$ powder as starting materials were weighed and mixed to yield mixtures each having a stoichiometric composition of Mg$_3$B$_2$O$_6$ or Mg$_2$B$_2$O$_5$, and the mixtures were wet-mixed for 16 hours, and were dried. The dried mixtures were calcined at 1400° C. for two hours and were then crushed to thereby yield a Mg$_3$B$_2$O$_6$ ceramic powder material and a Mg$_2$B$_2$O$_5$ ceramic powder material, respectively. At least one of the two ceramic powder materials was used as a calcined material in the following procedures.

Next, 20 to 80% by weight of the above-prepared calcined material, a glass powder (sintering aid) having a composition indicated in Table 4, and ZnO and CuO were mixed in the proportions indicated in Table 5, and the mixture was granulated with an appropriate amount of a binder. Each of granulated insulative ceramic compositions, Samples 1 to 46, was molded at a pressure of 200 MPa to yield a cylindrical green compact 12 mm in diameter and 7 mm in thickness.

The green compact was fired at a temperature from 900° C. to 1000° C. in air for two hours to yield each of cylindrical insulative ceramic compacts, Samples 1 to 46, shown in Tables 5 and 6. The relative densities of the above-prepared cylindrical insulative ceramic compacts are shown in Tables 5 and 6.

These cylindrical insulative ceramic compacts were subjected to measurement of relative dielectric constant $\in_r$ at a resonant frequency (15 GHz) by the method using a both-ends-short-circuited dielectric resonator, and of Q value. The results are shown in Tables 5 and 6.

The cylindrical insulative ceramic compacts were then subjected to measurement of thermal expansion coefficient according to the method described in Japanese Industrial Standards (JIS) R1618. The results are also shown in Tables 5 and 6.

TABLE 4

| Glass | SiO$_2$ (wt %) | B$_2$O$_3$ (wt %) | MgO (wt %) | Al$_2$O$_3$ (wt %) | BaO (wt %) | SrO (wt %) | CaO (wt %) | Li$_2$O (wt %) |
|---|---|---|---|---|---|---|---|---|
| A | 22 | 31 | 55 | — | — | — | — | 2 |
| B | 20 | 41 | 28 | 6 | — | — | — | 5 |
| C | 13 | 60 | 12 | 10 | — | — | — | 5 |
| D | 50 | 25 | 17 | 3 | — | — | — | 5 |
| E | 40 | 8 | 35 | 10 | — | — | — | 7 |
| F | 42 | 29 | 9 | 20 | — | — | — | — |
| G | 12 | 60 | 13 | 10 | — | — | — | 5 |
| H | 51 | 25 | 16 | 3 | — | — | — | 5 |
| I | 13 | 61 | 11 | 10 | — | — | — | 5 |
| J | 35 | 29 | 15 | 21 | — | — | — | — |
| K | 33 | 33 | — | — | — | — | 20 | 10 |
| L | 40 | 7 | 36 | 10 | — | — | — | 7 |
| M | 35 | 36 | — | 20 | 5 | 4 | — | — |
| N | 19 | 40 | 21 | — | — | — | 20 | — |
| O | 33 | 33 | 24 | — | — | — | — | 10 |
| P | 33 | 33 | 23 | — | — | — | — | 11 |
| Q | 22 | 30 | 56 | — | — | — | — | 2 |
| R | 35 | 36 | 10 | 10 | 5 | 4 | — | — |
| S | 19 | 40 | 20 | — | — | — | 21 | — |

TABLE 5

| No. | Mg$_2$B$_2$O$_5$ (wt %) | Mg$_3$B$_2$O$_6$ (wt %) | Glass Amount (wt %) | Type | ZnO (wt %) | CuO (wt %) | Firing Temperature (° C.) | Relative Density (%) | Thermal Expansion Coefficient (ppm/° C.) | $\epsilon_r$ | Q |
|---|---|---|---|---|---|---|---|---|---|---|---|
| 1 | 100 | 0 | 80 | A | 0 | 0 | 1000 | 97 | 10.5 | 7.0 | 1000 |
| 2 | 100 | 0 | 70 | A | 0 | 0 | 1000 | 97 | 10.3 | 7.0 | 1200 |
| 3 | 70 | 30 | 70 | A | 8 | 2 | 1000 | 98 | 10.2 | 7.0 | 1500 |
| 4 | 60 | 40 | 60 | A | 10 | 3 | 1000 | 99 | 9.8 | 7.1 | 1700 |
| 5 | 50 | 50 | 50 | A | 15 | 1 | 900 | 99 | 9.5 | 7.1 | 2000 |
| 6 | 30 | 70 | 20 | A | 0 | 3 | 1000 | 99 | 9.3 | 7.1 | 1100 |
| 7 | 0 | 100 | 20 | A | 0 | 3 | 1000 | 99 | 9.3 | 7.0 | 800 |
| 8 | 100 | 0 | 80 | A | 0 | 3 | 1000 | 97 | 10.0 | 7.0 | 800 |
| 9 | 50 | 50 | 50 | B | 10 | 2 | 900 | 100 | 9.2 | 7.0 | 2000 |
| 10 | 40 | 60 | 40 | B | 10 | 3 | 900 | 98 | 9.0 | 7.0 | 2200 |
| 11 | 60 | 40 | 60 | B | 9 | 2 | 900 | 98 | 9.1 | 7.0 | 1800 |
| 12 | 80 | 20 | 80 | B | 5 | 3 | 900 | 98 | 9.5 | 7.0 | 1000 |
| 13 | 100 | 0 | 80 | B | 15 | 3 | 900 | 98 | 9.1 | 7.0 | 1700 |
| 14 | 80 | 20 | 80 | B | 15 | 3 | 900 | 97 | 9.1 | 7.0 | 1700 |
| 15 | 50 | 50 | 50 | C | 0 | 0 | 900 | 99 | 9.3 | 7.1 | 800 |
| 16 | 40 | 60 | 40 | C | 7 | 0 | 900 | 99 | 9.2 | 7.0 | 900 |
| 17 | 0 | 100 | 40 | C | 11 | 0 | 900 | 99 | 9.1 | 7.1 | 1100 |
| 18 | 40 | 60 | 40 | C | 15 | 3 | 1000 | 98 | 9.0 | 7.0 | 1500 |
| 19 | 40 | 60 | 40 | C | 15 | 4 | 1000 | 98 | 9.0 | 7.0 | 1000 |
| 20 | 20 | 80 | 20 | C | 0 | 3 | 1000 | 98 | 9.0 | 7.0 | 900 |
| 21 | 10 | 90 | 20 | C | 0 | 3 | 1000 | 97 | 8.9 | 7.0 | 800 |
| 22 | 50 | 50 | 50 | D | 0 | 0 | 1000 | 98 | 9.2 | 7.1 | 900 |
| 23 | 50 | 50 | 50 | D | 13 | 1 | 1000 | 98 | 9.0 | 7.1 | 1500 |
| 24 | 50 | 50 | 50 | E | 5 | 3 | 1000 | 98 | 10.0 | 7.1 | 800 |
| 25 | 80 | 20 | 80 | F | 10 | 2 | 1000 | 97 | 9.5 | 7.0 | 600 |
| 26 | 90 | 10 | 90 | F | 10 | 2 | 1000 | 97 | 9.5 | 7.0 | 600 |
| 27 | 50 | 50 | 50 | G | 0 | 0 | 1000 | 97 | 9.3 | 7.0 | 600 |
| 28 | 50 | 50 | 50 | H | 0 | 0 | 1050 | 97 | 9.0 | 7.0 | 700 |
| 29 | 50 | 50 | 50 | H | 13 | 1 | 1050 | 98 | 8.6 | 7.1 | 800 |
| 30 | 50 | 50 | 50 | I | 0 | 0 | 900 | 99 | 9.1 | 7.1 | 600 |

TABLE 6

| No. | Mg$_2$B$_2$O$_5$ (wt %) | Mg$_3$B$_2$O$_6$ (wt %) | Glass Amount (wt %) | Type | ZnO (wt %) | CuO (wt %) | Firing Temperature (° C.) | Relative Density (%) | Thermal Expansion Coefficient (ppm/° C.) | $\epsilon_r$ | Q |
|---|---|---|---|---|---|---|---|---|---|---|---|
| 31 | 80 | 20 | 80 | J | 10 | 2 | 1000 | 97 | 9.1 | 7.0 | 550 |
| 32 | 50 | 50 | 50 | K | 13 | 3 | 1000 | 96 | 11.4 | 7.0 | 300 |
| 33 | 40 | 60 | 40 | K | 13 | 3 | 1000 | 96 | 11.0 | 7.0 | 220 |
| 34 | 50 | 50 | 50 | L | 5 | 3 | 1050 | 98 | 10.9 | 7.1 | 700 |
| 35 | 60 | 40 | 60 | M | 7 | 0 | 900 | 99 | 11.4 | 7.1 | 400 |
| 36 | 50 | 50 | 50 | M | 0 | 0 | 1000 | 96 | 11.6 | 7.0 | 300 |
| 37 | 50 | 50 | 50 | N | 4 | 2 | 1000 | 98 | 11.2 | 7.1 | 750 |
| 38 | 50 | 50 | 50 | O | 0 | 0 | 1000 | 97 | 10.3 | 7.1 | 800 |
| 39 | 60 | 40 | 60 | O | 5 | 2 | 900 | 98 | 10.1 | 7.0 | 1000 |
| 40 | 70 | 30 | 70 | O | 3 | 3 | 900 | 98 | 10.2 | 7.0 | 1100 |
| 41 | 50 | 50 | 50 | O | 0 | 0 | 1000 | 97 | 10.4 | 7.1 | 800 |
| 42 | 50 | 50 | 50 | P | 0 | 0 | 1000 | 98 | 10.3 | 7.0 | 700 |
| 43 | 80 | 20 | 80 | Q | 0 | 0 | 1000 | 96 | 10.5 | 6.9 | 600 |
| 44 | 60 | 40 | 60 | R | 7 | 0 | 900 | 99 | 11.6 | 7.1 | 800 |
| 45 | 50 | 50 | 50 | R | 0 | 0 | 1000 | 96 | 11.4 | 7.0 | 700 |
| 46 | 50 | 50 | 50 | S | 4 | 2 | 1000 | 98 | 11.3 | 7.1 | 700 |

Samples 25 through 36 and 43, using as a glass any of Glasses F through M and Q that are outside the scope of the present invention, were inferior to the other insulative ceramic compacts corresponding to the invented examples. Specifically, the insulative ceramic compacts according to Samples 25 through 27 had a low Q value of 600. The insulative ceramic compacts according to Samples 28 and 29 using Glass H could not be fired at temperatures which did not exceed 1000° C. The insulative ceramic compact of Sample 30 using Glass I had a low Q value of 600.

The insulative ceramic compact according to Sample 31 using Glass J had a low Q value of 550.

The insulative ceramic compacts according to Samples 32 and 33 had low Q values of 300 and 220. This is probably because these samples used Glass K.

The insulative ceramic compact according to Sample 34 using Glass L could not be fired at temperatures of 1000° C. or less.

Insulative ceramic compacts according to Samples 35 and 36 each using Glass M had low Q values of 400 and 300, respectively.

The insulative ceramic compact according to Sample 43 using Glass Q had a low Q value of 600.

In contrast, the insulative ceramic compacts of the other samples corresponding to the invented examples were each composed of an insulative ceramic compact of the present invention and could be obtained by firing at low temperatures from 900° C. to 1000° C. to yield insulative ceramic compacts each having a relative density of 97% or more. The resulting insulative ceramic compacts each had a low relative dielectric constant of about 7, a thermal expansion coefficient from 8 to 12 ppm/° C., and a high Q value at a frequency of 15 GHz of 700 or more.

According to the present invention, therefore, insulative ceramic compacts each having a Qf value at 15 GHz of 10,000 GHz or more by firing at low temperatures. The resulting insulative ceramic compacts have a high thermal expansion coefficient and therefore can be obtained by sintering in conjunction with a highly dielectric material having a high thermal expansion coefficient.

The insulative ceramic compacts according to the present invention had a relative density of 97% or more, i.e., satisfactory mechanical strengths (200 MPa or more), and had a low relative dielectric constant and a high Q value measured at a frequency of 10 GHz of 400 or more, even when they were obtained by firing at low temperatures of 1000° C. or less. Accordingly, the present invention can provide insulative ceramic compacts that can be obtained by firing at low temperatures and are optimally useful for high-frequency electronic parts.

Advantages

The invented insulative ceramic compact is composed of a $MgAl_2O_4$ ceramic powder and the glass powder having the above specified composition, and can therefore be obtained by firing at low temperatures of about 1000° C. or less. Accordingly, the ceramic compact can be obtained by monolithically firing with conductive materials composed of low-melting metals such as copper and silver, and can employ these conductive materials as, for example, inner electrodes. The invented insulative ceramic compact can be advantageously used in a multilayer ceramic substrate, which can be obtained by firing at low temperatures, and can reduce costs of such multilayer substrates. Additionally, the invented insulative ceramic compact has a high Q value and a low dielectric constant in the high-frequency range and can therefore yield, for example, a multilayer substrate having satisfactory high-frequency characteristics.

When the glass powder for use in the present invention further comprises about 20% by weight or less of at least one alkaline earth metal oxide selected from among BaO, SrO and CaO, the melting temperature in the manufacture of glass powder can be decreased to thereby reduce manufacturing cost of the invented insulative ceramic compact.

When the glass powder comprises about 10% by weight or less of at least one alkali metal oxide selected from among $Li_2O$, $K_2O$ and $Na_2O$ relative to the total weight of the glass powder, the melting temperature in the manufacture of glass powder can also be decreased to thereby reduce manufacturing cost of the glass powder, and a decreased Q value can be avoided.

The insulative ceramic compact, if it further includes about 15% by weight or less of zinc oxide in terms of ZnO, can decrease the firing temperature of insulative ceramic compact and can yield a dense sintered compact.

The insulative ceramic compact, if it further includes about 3% by weight or less of copper oxide in terms of CuO relative to the total weight of the ceramic compact, can also decrease the firing temperature and can have a high Q value.

When the weight ratio of the ceramic powder to the glass powder contained in the ceramic compact falls in a range from about 20:80 to 80:20, the resulting insulative ceramic compact can become further dense and can maintain a high Q value by the use of the glass powder.

The invented multilayer ceramic substrate includes an insulative ceramic layer composed of the invented insulative ceramic compact and therefore can be obtained by firing at low temperatures and can employ Ag, Cu and other low-resistance low-cost metals as materials for inner electrodes. Additionally, the insulative ceramic layer has a low dielectric constant and a high Q value and can yield a multilayer ceramic substrate suitable for use in the high-frequency range.

When the multilayer ceramic substrate has a second ceramic layer laminated at least on one side of the insulative ceramic layer and the second ceramic layer has a dielectric constant higher than that of the insulative ceramic layer, the strengths and environmental resistance of the multilayer ceramic substrate can be appropriately controlled according to necessity by appropriately designing the composition of the second ceramic layer and lamination structure.

When the plural inner electrodes are arrayed in parallel with each other with the interposition of at least part of the insulative ceramic layer to thereby constitute a multilayer capacitor, the resulting capacitor is suitable for use in the high-frequency range, as the invented insulative ceramic compact has a low dielectric constant and a high Q value.

Additionally, the invented multilayer ceramic substrate can easily constitute a miniaturized LC resonant circuit which is suitable for use in the high-frequency range when the plurality of inner electrodes include inner electrodes constituting a multilayer capacitor and conductive coils connected with each other to constitute a multilayer inductor. This is because the invented insulative ceramic compact has a low dielectric constant and a high Q value in the high-frequency range.

The invented ceramic electronic part including the invented multilayer ceramic substrate and at least one electronic part device mounted on the substrate can provide various miniaturized ceramic electronic parts useful in the high-frequency range by utilizing the electronic part device and the circuitry in the multilayer ceramic substrate.

When a cap is fixed to the multilayer ceramic substrate so as to surround the electronic part device, the cap can protect the electronic part device and the resulting ceramic electronic part is satisfactory in moisture resistance and other properties.

The use of a conductive cap as the cap can electromagnetically shield the surrounded electronic part device.

The multilayer ceramic substrate can be easily mounted on the surface of a printed circuit board or other devices from the underside of the substrate when outer electrodes are only formed on the underside of the multilayer ceramic substrate.

A multilayer ceramic electronic part relating to the present invention includes a plurality of inner electrodes formed inside the invented insulative ceramic compact and can be obtained by firing at low temperatures and can employ Ag, Cu, and other low-resistance low-cost metals as materials for inner electrodes. Additionally, the insulative ceramic compact has a low dielectric constant and a high Q value to thereby yield a multilayer capacitor suitable for use in the high-frequency range.

The multilayer ceramic electronic part relating to the invention can yield a capacitor suitable for use in the high-frequency range when the plurality of inner electrodes constitute a multilayer capacitor, as the invented insulative ceramic compact has a low dielectric constant and a high Q value.

The multilayer ceramic electronic part can easily constitute a miniaturized LC resonant circuit which is suitable for use in the high-frequency range when the plurality of inner electrodes include inner electrodes constituting a multilayer capacitor and conductive coils constituting a multilayer inductor. This is because the invented insulative ceramic compact has satisfactory mechanical strengths and has a low dielectric constant and a high Q value in the high-frequency range as described above.

The invented insulative ceramic compact composed of at least one of a $Mg_3B_2O_6$ ceramic powder and a $Mg_2B_2O_5$ ceramic powder and the glass powder having the above specified composition also has the foregoing advantages.

Other embodiments and variations will be obvious to those skilled in the art, and this invention is not to be limited to the specific matters stated above.

What is claimed is:

1. An insulative ceramic compact comprising a fired mixture of:
   (A) a ceramic powder selected from the group consisting of $MgAl_2O_4$ $Mg_3B_2O_6$ and $Mg_2B_2O_5$; and
   (B) a glass powder comprising from about 13 to 50% by weight of silicon oxide calculated as $SiO_2$, from about 8 to 60% by weight of boron oxide calculated as $B_2O_3$, from 0 to about 20% by weight of aluminum oxide calculated as $Al_2O_3$ and from about 10 to 55% by weight of magnesium oxide calculated as MgO.

2. An insulative ceramic compact according to claim 1, wherein said glass comprises about 20 to 30% by weight of silicon oxide calculated as $SiO_2$, from about 30 to 60% by weight of boron oxide calculated as $B_2O_3$, from 0 to about 20% by weight of aluminum oxide calculated as $Al_2O_3$, and from about 10 to 55% by weight of magnesium oxide calculated as MgO.

3. An insulative ceramic compact according to claim 2, wherein said glass powder further comprises up to about 20% by weight or less relative to the total weight of the glass powder of at least one alkaline earth metal oxide selected from the group consisting of CaO, BaO and SrO, and up to about 10% by weight or less relative to the total weight of the glass powder of at least one alkali metal oxide selected from the group consisting of $Li_2O$, $K_2O$ and $Na_2O$; and
   wherein said compact further comprises up to about 15% by weight relative to the total weight of said ceramic compact of zinc oxide calculated as ZnO and up to about 3% by weight or less relative to the total weight of said ceramic compact of copper oxide in a proportion calculated as CuO.

4. An insulative ceramic compact according to claim 3, wherein the weight ratio of said ceramic powder to said glass powder contained in said insulative ceramic compact is in a range from about 20:80 to 80:20.

5. An insulative ceramic compact according to claim 4, wherein the weight ratio of said ceramic powder to said glass powder contained in said insulative ceramic compact is in a range from about 30:70 to 50:50.

6. An insulative ceramic compact according to claim 1, wherein said glass powder further comprises at least one alkaline earth metal oxide selected from the group consisting of CaO, BaO and SrO in a proportion of about 20% by weight or less relative to the total weight of the glass powder.

7. An insulative ceramic compact according to claim 1, wherein said glass powder further comprises at least one alkali metal oxide selected from the group consisting of $Li_2O$, $K_2O$ and $Na_2O$ in a proportion of about 10% by weight or less relative to the total weight of the glass powder.

8. An insulative ceramic compact according to claim 1, further comprising zinc oxide in a proportion calculated as ZnO of about 15% by weight or less relative to the total weight of said ceramic compact.

9. An insulative ceramic compact according to claim 1, further comprising copper oxide in a proportion calculated as CuO of about 3% by weight or less relative to the total weight of said ceramic compact.

10. An insulative ceramic compact according to claim 1, wherein the weight ratio of said ceramic powder to said glass powder contained in said insulative ceramic compact is in a range from about 20:80 to 80:20.

11. An insulative ceramic compact according to claim 1, wherein said ceramic powder comprises $MgAl_2O_4$.

12. An insulative ceramic compact according to claim 1, wherein said ceramic powder comprises $Mg_3B_2O_6$.

13. An insulative ceramic compact according to claim 1, wherein said ceramic powder comprises $Mg_2B_2O_5$.

14. A multilayer ceramic substrate comprising an insulative ceramic layer comprising an insulative ceramic compact according to claim 1 having a plurality of electrodes within said insulative ceramic layer.

15. A multilayer ceramic substrate according to claim 14, having a second ceramic layer laminated on at least one side of said insulative ceramic layer, wherein said second ceramic layer has a dielectric constant higher than the dielectric constant of said insulative ceramic layer.

16. A multilayer ceramic substrate according to claim 14, wherein a pair of said plurality of electrodes are arrayed in parallel with each other with the interposition of at least part of said insulative ceramic layer to thereby constitute a capacitor.

17. A multilayer ceramic substrate according to claim 14, wherein a number of said plurality of electrodes are interconnected so as to form a conductive coil.

18. A ceramic electronic part comprising a multilayer ceramic substrate according to claim 14 and at least one electronic part device, wherein said electronic part device is mounted on said multilayer ceramic substrate and constitutes a circuit with a number of said plurality of electrodes.

19. A ceramic electronic part according to claim 18, further comprising a cap being fixed to said multilayer ceramic substrate so as to surround said electronic part device.

20. A ceramic electronic part according to claim 19, wherein said cap is conductive.

* * * * *